US012750040B2

(12) United States Patent
Volmer

(10) Patent No.: US 12,750,040 B2
(45) Date of Patent: Sep. 29, 2026

(54) SIGNAL PROCESSING APPARATUS FOR GENERATING A PLURALITY OF OUTPUT SAMPLES USING COMBINER LOGIC BASED ON A HIEARCHICAL TREE STRUCTURE

(71) Applicant: Advantest Corporation, Tokyo (JP)

(72) Inventor: Christian Volmer, Stuttgart (DE)

(73) Assignee: Advantest Corporation, Tokyo (JP)

( * ) Notice: Subject to any disclaimer, the term of this patent is extended or adjusted under 35 U.S.C. 154(b) by 1034 days.

(21) Appl. No.: 17/824,712

(22) Filed: May 25, 2022

(65) Prior Publication Data

US 2022/0283983 A1 Sep. 8, 2022

Related U.S. Application Data

(63) Continuation of application No. PCT/EP2019/086997, filed on Dec. 23, 2019.

(51) Int. Cl.
*H03H 17/06* (2006.01)
*H03H 17/02* (2006.01)

(52) U.S. Cl.
CPC .... *H03H 17/0685* (2013.01); *H03H 17/0286* (2013.01); *H03H 17/0273* (2013.01); *H03H 17/028* (2013.01); *H03H 17/0664* (2013.01)

(58) Field of Classification Search
CPC ........... H03H 17/0685; H03H 17/0286; H03H 17/0273; H03H 17/028; H03H 17/0664
See application file for complete search history.

(56) References Cited

U.S. PATENT DOCUMENTS 8,289,195 B1 10/2012 Dong et al.
8,786,472 B1 7/2014 Prince
2005/0243952 A1* 11/2005 Li ........................... H04B 1/40 375/343

(Continued)

FOREIGN PATENT DOCUMENTS

CN 108173795 A 6/2018

OTHER PUBLICATIONS

Peterson, Fredrik. "Arbitrary Decimation for High Sample Rates, Algorithm Design and FPGA implementation." Sep. 10, 2019, http://lup.lub.lu.se/student-papers/record/8993271 (2019). (Year: 2019).*

*Primary Examiner* — Carlo Waje
(74) *Attorney, Agent, or Firm* — Artegis Law Group, LLP

(57) ABSTRACT

Embodiments of the present invention provide a digital signal processing apparatus including a combiner logic and a plurality of processing cores. Input samples of the digital signal processing apparatus are provided to the plurality of processing cores. Sets of output samples of the processing cores are provided to the combiner logic as input samples, and the sets of samples are provided to the combiner nodes c of the highest hierarchical level (h=0). A digital signal processing apparatus or a parallel decimating digital convolver may be used as a building block of a signal processor application-specific integrated circuit (ASIC) and/or part of other instruments for generating output samples. Furthermore, applications of the digital signal processing apparatus described herein can be addressed on a parallel DSP, in a response time of real-time or near to real-time, for flexible (or almost arbitrary high) sample rates.

19 Claims, 8 Drawing Sheets

(56) References Cited

U.S. PATENT DOCUMENTS

| | | | | |
|---|---|---|---|---|
| 2005/0286619 | A1 | 12/2005 | Haddadin et al. | |
| 2006/0250287 | A1* | 11/2006 | Menkhoff | H03H 17/0657 341/118 |
| 2010/0209883 | A1 | 8/2010 | Chin et al. | |
| 2010/0321216 | A1 | 12/2010 | Jonsson | |
| 2013/0243203 | A1 | 9/2013 | Franck et al. | |
| 2014/0266820 | A1 | 9/2014 | Kiss et al. | |
| 2017/0170838 | A1 | 6/2017 | Pagnanelli | |
| 2020/0394021 | A1* | 12/2020 | Yadav | H03H 17/06 |

* cited by examiner

SIGNAL PROCESSING APPARATUS FOR GENERATING A PLURALITY OF OUTPUT SAMPLES USING COMBINER LOGIC BASED ON A HIEARCHICAL TREE STRUCTURE

CROSS-REFERENCE TO RELATED APPLICATIONS

This application claims the benefit of and priority to international patent application PCT/EP2019/086997, with filing date Dec. 23, 2019, which is hereby incorporated by reference in its entirety.

FIELD

Embodiments of the present invention relate to digital signal processing. More specifically, embodiments relate to real-time waveform generation on digital signal processors.

BACKGROUND

Decimation is a process that involves downsampling a signal or sequence to produce an approximation of a result obtained by sampling the signal at a lower rate. In other words, the output sample rate is generally no greater than the input sample rate.

A decimator or a decimating convolver convolves an input waveform having equidistant sampling using a continuous-time impulse response and outputs the result of at a sample rate no greater than the input rate. The continuous-time impulse response is time stretched in proportion to the sample rate ratio. When the impulse response is selected appropriately, a decimator can suppress spectral content in the input waveform that would otherwise produce undesired aliasing effects at the output sample rate.

The decimator can include an algorithmic architecture for convenient implementation using an application specific integrated circuit (ASIC) or field-programmable gate array (FPGA). A conventional decimator can be implemented as a transposed Farrow structure, for example. The impulse response of the transposed Farrow structure is described in a piecewise polynomial fashion.

In some implementations for performing a decimating convolution or a decimating digital convolution on a sequential DSP, a time accumulator accumulates fractional samples in a half-open interval [0:1) with an increment of $\Delta t$. The decimation ratio is $1/\Delta t$, wherein $\Delta t$ is within the half open interval [0:1). When the time accumulator overflows, the decimator emits one output sample and shifts the output samples in an output accumulator by one position.

The output accumulator prepares a plurality of output samples and accumulates or integrates the results of a plurality of "dot-cores" that compute a dot product or a scalar vector product between a vector of coefficients and a corresponding output vector of a polynomial evaluator. The coefficients of the dot-cores determine the continuous time convolution kernel, and therefore the response of the decimator, in a piecewise polynomial fashion.

The number of output samples in the plurality of output samples or the number of corresponding dot cores, M, is called the "support" of the Farrow decimator, while the number of coefficients, N, in the vector of coefficients is the "degree" of the Farrow decimator.

The polynomial evaluator multiplies an input sample by successive powers (e.g., 0, 1, . . . N) of the accumulated fractional time. The amplitude of an output waveform is scaled by $1/\Delta t$, as the result of the accumulation process. In order for the output amplitude to match the input or input amplitude, every output sample is multiplied by $\Delta t$.

A conventional Farrow implementation processes one sample at a time (parallelism equals 1). Whenever the sample rate is higher than the clock rate of the digital signal processor, there is a need for performing parallel processing operations (e.g. on a common set of samples), while keeping an effort for combining samples reasonably small.

An improved approach to input sampling using parallel processing operations is desired.

SUMMARY

Accordingly, embodiments of the present invention provide a digital signal processing apparatus including a combiner logic and a plurality of processing cores. Input samples of the digital signal processing apparatus are provided to the plurality of processing cores. Sets of output samples of the processing cores are provided to the combiner logic as input samples, and the sets of samples are provided to the combiner nodes c of the highest hierarchical level (h=0). A digital signal processing apparatus or a parallel decimating digital convolver may be used as a building block of a signal processor application-specific integrated circuit (ASIC) and/or part of other instruments for generating output samples. Furthermore, applications of the digital signal processing apparatus described herein can be addressed on a parallel DSP, in a response time of real-time or near to real-time, for flexible (or almost arbitrary high) sample rates.

According to one embodiment, a signal processing apparatus for generating a plurality of output samples based on a plurality of input samples is disclosed. The signal processing apparatus includes a plurality of processing cores configured to perform processing operations based on sets of the plurality of input samples and an associated processing time to generate sets of processing core output samples, and a sample combiner logic unit coupled to the plurality of processing cores and configured to provide the plurality of output samples from the sets of processing core output samples. The sample combiner logic unit is operable to process a hierarchical tree structure having a plurality of hierarchical levels of combiner nodes, and a combiner node associated with a higher hierarchical level is operable to provide a set of combined output samples based on two or more sets of processing core output samples. A combiner node associated with a lower hierarchical level is operable to provide a set of combined output samples based the set of combined output samples of the higher hierarchical level. The sets of input samples are shifted based on time information associated with the sets of input samples.

According to some embodiments, a target output sample rate of the plurality of output samples is no greater than an input sample rate of the plurality of input samples.

According to some embodiments, the method includes a time accumulator operable to track a global processing time, and access a plurality of output samples from an output register coupled to the sample combiner logic unit when the global processing time overflows a predetermined multiple of a sampling period of the plurality of output samples.

According to some embodiments, a number of samples in the sets of input samples provided to combiner nodes in a same hierarchical level are the same.

According to some embodiments, a number of samples in sets of output samples provided to combiner nodes in a same hierarchical level are the same.

According to some embodiments, the sample combiner logic unit is further operable to provide a number of input samples, wherein the number progressively increases as the respective hierarchical level decreases.

According to some embodiments, the set of input samples and a output samples of a respective combiner node are based on at least one of: a number of samples of the set of output samples output by a respective processing core; a hierarchical level of a respective combiner node; and a factorization of a number of processing cores as integer factors.

According to some embodiments, the number of sets of input samples of a respective combiner node is based on a factorization of the number of processing cores into integer factors.

According to some embodiments, a number of sets of input samples provided to a respective combiner node of a hierarchical level is equal to $p_h$, wherein $p_k$ represent integer factors of P according to $$P = \prod_{k=0}^{H-1} p_k,$$

wherein P represents a number of processing cores, wherein H represents a total number of factors in a chosen integer factorization, and h represents a hierarchical level of the respective combiner node.

According to some embodiments, the combiner nodes of the sample combiner logic unit are operable to provide the set of combined output samples.

According to some embodiments, the set of combined output samples is a combination of the sets of input samples, and wherein a number of samples of the sets of input samples are shifted with respect to one another before being combined.

According to some embodiments, the combiner nodes are operable to provide the set of combined output samples by summing the sets of input samples, wherein the sets of input samples are padded after the summing, and wherein a number and a position of padding of the plurality of input samples is based on time information of the plurality of input samples.

According to some embodiments, combiner nodes of the higher hierarchical level are operable to receive time information associated with the sets of input samples, and wherein the time information corresponds to a processing time associated with the sets of input samples.

According to some embodiments, the apparatus further includes an output register configured to store the plurality of output samples and to accumulate and integrate values of output samples.

According to some embodiments, the apparatus further includes an accumulator and a shift register.

According to some embodiments, the plurality of processing cores comprise a transposed Farrow structure.

According to some embodiments, the hierarchical tree structure comprises a plurality of subtrees derived from integer factors of a number of processing cores.

According to some embodiments, the hierarchical tree structure comprises a plurality of subtrees derived from orderings of integer factors of a number of processing cores.

According to a different embodiment, a method of providing a plurality of output samples based on a plurality of input samples is disclosed. The method includes generating sets of output samples using a plurality of processing cores wherein said generating is based on input samples and associated processing times, wherein the plurality of output samples comprise a hierarchical tree structure comprising a plurality of hierarchical levels, combining output samples of a higher hierarchical level based on two or more sets of output samples of the plurality of output samples to generate combined output samples, and combining output samples of a lower hierarchical level based on two or more sets of the combined output samples of the higher hierarchical level.

According to another embodiment, a non-transitory computer-readable storage medium is disclosed. The medium has embedded therein program instructions, which when executed by one or more processors of a device, causes the device to execute a method of generating a plurality of output samples based on a set of input samples. The method includes generating sets of output samples using a plurality of processing cores wherein said generating is based on input samples and associated processing times, wherein the plurality of output samples comprise a hierarchical tree structure comprising a plurality of hierarchical levels, combining output samples of a higher hierarchical level based on two or more sets of output samples of the plurality of output samples to generate combined output samples, and combining output samples of a lower hierarchical level based on two or more sets of the combined output samples of the higher hierarchical level.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

In the following, different inventive embodiments and aspects will be described. Also, further embodiments will be defined by the enclosed claims.

It should be noted that any embodiments as defined by the claims may be supplemented by any of the details, features and functionalities described herein. Also, the embodiments described herein may be used individually, and may also optionally be supplemented by any of the details, features and functionalities included in the claims.

Also, it should be noted that individual aspects described herein may be used individually or in combination. Thus, details may be added to each of said individual aspects without adding details to another one of said aspects. It should also be noted that the present disclosure describes, explicitly or implicitly, features usable in a test arrangement or in an automatic test equipment (ATE). Thus, any of the features described herein may be used in the context of a test arrangement or in the context of an automatic test equipment.

Moreover, features and functionalities disclosed herein, relating to a method, may also be used in an apparatus configured to perform such functionality. Furthermore, any features and functionalities disclosed herein with respect to an apparatus may also be used in a corresponding method. In other words, the methods disclosed herein may be supplemented by any of the features and functionalities described with respect to the apparatuses.

The present invention will be understood more fully from the detailed description given below, and from the accompanying drawings of embodiments of the present invention, which, however, should not be taken to limit the present invention to the specific embodiments described, but are for explanation and understanding only.

Generating a Plurality of Output Samples Using Combiner Logic Based on a Hierarchical Tree Structure Embodiments of the present invention provide a digital signal processing apparatus including a combiner logic and a plurality of processing cores. Input samples of the digital signal processing apparatus are provided to the plurality of processing cores. Sets of output samples of the processing cores are provided to the combiner logic as input samples, and the sets of samples are provided to the combiner nodes c of the highest hierarchical level (h=0). A digital signal processing apparatus or a parallel decimating digital convolver may be used as a building block of a signal processor application-specific integrated circuit (ASIC) and/or part of other instruments for generating output samples. Furthermore, applications of the digital signal processing apparatus described herein can be addressed on a parallel DSP, in a response time of real-time or near to real-time, for flexible (or almost arbitrary high) sample rates.

Figure 1:
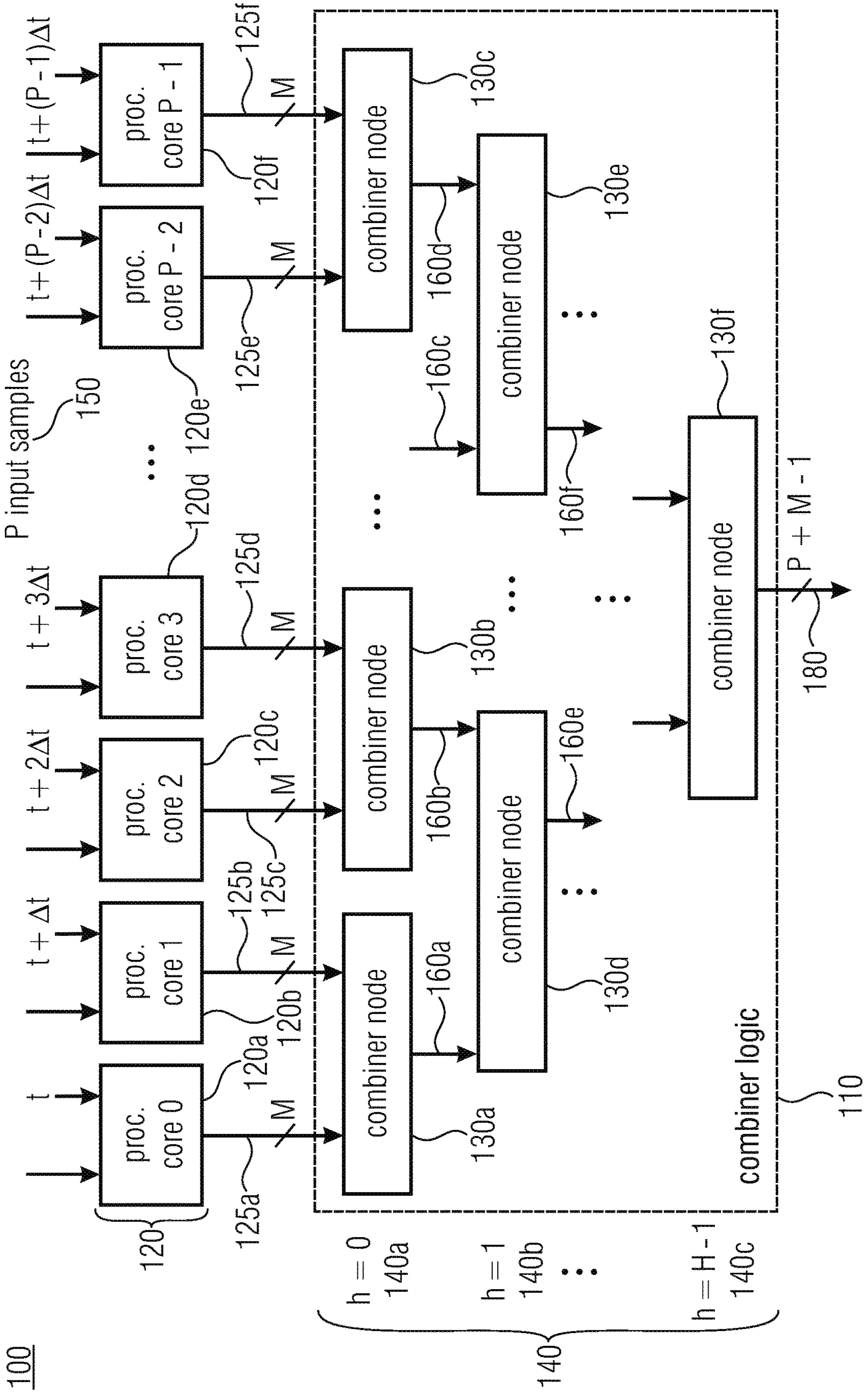
FIG. 1 is a block diagram of an exemplary signal processing apparatus, including a combiner logic and a plurality of processing cores according to embodiments of the present invention.

FIG. 1 is a block diagram of an exemplary digital signal processing apparatus 100 including a combiner logic 110 and a plurality of processing cores 120 according to embodiments of the present invention. The combiner logic 110 includes a plurality of combiner nodes 130*a-f* organized in a hierarchical tree structure 140 of different hierarchical levels 140*a-c*.

The input samples 150 of the digital signal processing apparatus are provided to the plurality of processing cores 120. The plurality of processing cores 120 includes processing cores 120*a-f*. The input of the processing cores 120*a-f* are the input of the digital signal arrangement 100. The outputs 125*a-f* of the processing cores 120*a-f* are coupled to combiner logic unit or module 110. The processing cores 120*a-f* are associated with different processing times, and are configured to take one input sample from the input samples 150 and to provide a set of output samples 125*a-f* each (e.g., M output samples) to the combiner logic 110.

Sets of output samples 125*a-f* of the processing cores 120*a-f* are provided to the combiner logic 110 as input samples, and the sets of samples 125*a-f* are provided to the combiner nodes 130*a-c* of the highest hierarchical level 140*a* (h=0). The combiner nodes 130*a-c* take the input set of samples 125*a-f* as input and provide combined sets 160*a-d* to the combiner nodes 130*d-e* on the next lower hierarchical level 140*b*. The number of samples in the sets of output samples on the same hierarchical level are identical. For example, the sets of output samples 160*a-d* on the level 140*a* have the same number of samples, and the sets of output samples 160*e-f* on the level 140*b* have the same number of samples.

Any given combiner node 130*a-f* takes two or more sets of input samples from the next higher hierarchical level. For example the combiner node 130*d* takes sets of input samples 160*a-b* from the combiner nodes 130*a-b* on the hierarchical level 140*a*, and provides one combined set (e.g., combined set 160*e*) to a combiner node on the next lower hierarchical level (e.g., combiner node 130*f* on hierarchical level 140*c*). The combiner logic has a hierarchical tree structure 140 of combiner nodes 130*a-f*, and the combiner node 130*a-c* of a highest hierarchical level takes sets of input samples 125*a-f* from a respective processing core 120*a-f*. The other combiner nodes 130*d-f* take a set of input samples from the next higher hierarchical level.

The combiner node 130*f* of the lowest hierarchical level 140*c* provides an output 180 (the output of the combiner logic 110) and the output of the signal processing apparatus. The outputs of the other combiner nodes 130*a-e* of the combiner logic 110 are coupled with one of the inputs of the combiner node 130*d-f* of the next lower hierarchical level. In other words, the digital signal processing apparatus 100 is configured to provide a plurality of output samples 180 from a plurality of input samples 150. The plurality of processing cores 120 perform processing operations in parallel, and the processing cores 120*a-f* are associated with different processing times. The sets of output samples 125*a-f* of the processing cores 120*a-f* are provided to the combiner logic 110 as sets of input samples.

Combiner logic 110 provides a set of output samples 180 from the sets of input samples 125*a-f* using a hierarchal tree structure 140 of combiner nodes 130*a-f* organized in hierarchical levels 140*a-c*. The input samples 150 are provided to the processing cores 120*a-f* as input for generating the sets of output samples 125*a-d* to be provided to the combiner logic 110. The number of samples in the sets 125*a-f* are equal for all of the sets 125*a-f*. Each level 140*a-c* of the combiner logic 110 includes combiner nodes 130*a-f*, and a combiner node 130*a-f* of a given hierarchical level 140*a-c* takes two or more sets 125*a-f*, 160*a-f* of input samples from the next higher hierarchical level and provides one set 160*a-f* for the next lower hierarchical level 140*a-c*.

A digital signal processing apparatus 100 or a parallel decimating digital convolver 100 described herein may be used as a building block of a signal processor application-specific integrated circuit (ASIC) and/or part of other instruments for generating output samples. Furthermore, applications of the digital signal processing apparatus described herein can be addressed on a parallel DSP, in a response time of real-time or near to real-time, for flexible (or almost arbitrary high) sample rates. For example, digital signal processing apparatus 100 can address a sample rate of 100 GSa/s in near to real-time, according to some embodiments. The digital processing apparatus is a compact implementation of a processing architecture using parallel processing cores.

The signal processing apparatus can also be used to provide, in near to real-time a high quality, flexible (or almost arbitrary) sample rate conversion for radio frequency (RF) and analogue baseband applications. In one example, the usable bandwidth is 75% of the Nyquist rate and can achieve 60 dB image suppression. The conversion ratio is not significantly limited to a simple fractions but is truly flexible (or almost arbitrary) in the sense that it can be programmed as a number between 0 and 1 with 64 bits of resolution. Advantageously, sample rates far beyond the clock rate of the DSP can be addressed.

According to some embodiments, the signal processing apparatus can be used to sample digitized non-return-to-zero (NRZ) digital waveforms and/or Pulse-amplitude modulation (PAM) digital waveforms for flexible (or almost arbitrary) user bit rates. Drifting digital waveforms can be tracked with a clock recovery loop. Digital signal processing apparatus can provide sub-sample resolution delay for a time-to-digital (TDC) based synchronization mechanism.

Figure 2:
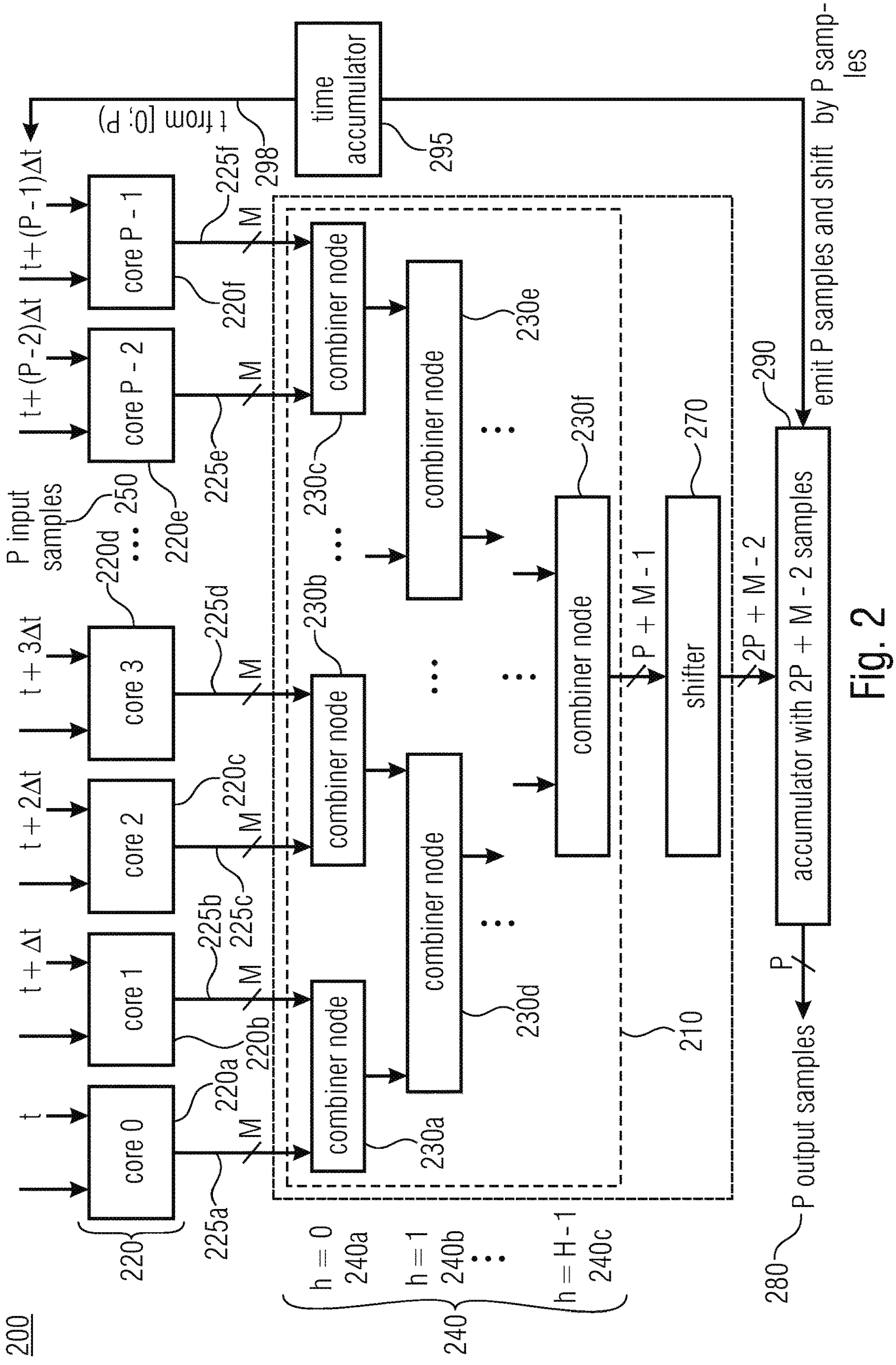
FIG. 2 is a block diagram of an exemplary signal processing apparatus extended with a time accumulator, a shifter and an accumulator module according to embodiments of the present invention.

FIG. 2 is a block diagram of an exemplary signal processing apparatus 200 which can be an enhanced or extended version of the digital signal processing apparatus 100 of FIG. 1 according to embodiments of the present invention. The output of the digital signal processing apparatus 200 is coupled to a shifter 270. The shifter 270 has one input and one output and the output of the shifter 270 is coupled to an accumulator 290.

The accumulator 290 has two inputs and one output. The first input of the accumulator 290 is coupled to the shifter 270 and the second input of the accumulator 290 is coupled to a time accumulator 295. The output of the accumulator 290 is the output of the extended digital signal arrangement 200. The time accumulator 295 is coupled with the accumulator 290 and is configured to trigger emitting output samples of the digital signal processing apparatus 200 and is configured to provide time information to the processing cores and/or to the combiner logic 210.

The input samples 250 of the signal processing apparatus 200 are provided to a plurality of processing cores 220 including processing cores 220*a-f*. The processing cores 220*a-f* are coupled to the combiner logic 210. The processing cores 220*a-f* take an input sample as input, and provide a set of output sample 225*a-f* as output. The sets of output samples 225*a-f* are the sets of input samples of the combiner logic 210. According to the example of FIG. 2, the processing cores 220*a-f* have one input and one output.

The combiner logic 210, which can be similar to the combiner logic 110 of FIG. 1, includes a hierarchical tree structure 240 of combiner nodes 230*a-f* organized in a plurality of hierarchical levels 240*a-c*. The input of the combiner nodes 230*a-c* on the highest hierarchical level 240*a* of the combiner logic 210 are the input of the combiner logic 210. The combiner nodes 230*a-c* have two or more inputs coupled to processing cores 220*a-f* of the plurality of processing cores 220, which can be similar to the plurality of processing cores 120 of FIG. 1.

Combiner node 230*a-f* of the combiner logic 210 has one output and two or more inputs. Inputs of a given combiner node 230*a-f* are coupled to another combiner node 230*a-f* on a next higher hierarchical level 240*a-c*, and the output of the combiner nodes 230*a-f* is coupled to a combiner node 230*a-f* on a next lower hierarchical level 240*a-c*. The output samples of the combiner node 230*f* of the lowest hierarchical level 240*c* are the output samples of the combiner logic 210. The combiner node 230*f* of the lowest hierarchical level 240*c* of the combiner logic 210 is coupled to an accumulator 290 via the shifter 270. According to some embodiments, digital signal processing apparatus 200 includes the digital signal processing apparatus 100, and is extended by a shifter 270, an accumulator 290 and a time accumulator 295.

The time accumulator 295 tracks the processing times and triggers P output samples 280 from the accumulator 290 whenever the processing time overflows a predetermined multiple of a sampling period of the output samples. The accumulator 290 is configured to accumulate and/or integrate samples provided by the shifter 270 to provide output samples 280. The output samples 280 of the accumulator 290 are the output samples of the extended signal processing apparatus 200. The shifter 270 prepends and/or appends zeros to the output samples of the combiner logic 210, and selects a predefined number of samples (e.g., 2P+M−2 samples) from the zero-padded set of samples to provide the selected set of samples to the accumulator 290 as input.

Processing cores 220*a-f*, which may include Farrow cores, provide a set of M samples from the input sample of the input samples 250 to combiner logic 210. The input samples of the combiner logic 210 provided by the plurality of processing cores 220 are input samples of the combiner nodes 230*a-c* in the first hierarchical layer 240*a* along with time information based on the accumulated processing time 298. A respective combiner node 230*a-f* on a respective hierarchical level 240*a-c* assigns time information to each set of output samples, and the time information can be based on a processing time tracked by the time accumulator 295.

Combiner nodes 230*a-f* of combiner logic 210 combine the sets of input samples into a set of output samples as an input to a combiner node 230*a-f* on a lower hierarchical level. Furthermore, a combiner node 230*a-f* of a respective hierarchical level 240*a-c* assigns time information (based on accumulated processing times 298) to the set of output samples based on the time information assigned to the sets of input samples of the respective combiner node 230*a-f*. The accumulated processing times 298 tracked by the time accumulator 295 may be equidistant or non-equidistant, depending on whether a timing jitter is applied or not. A combiner node 230*f* of the lowest hierarchical level 240*c* provides output samples to the accumulator 290 via a shifter 270 to accumulate and/or integrate the zero-padded output samples into a set of output samples 280.

The digital signal processing apparatus 200 can advantageously perform the same and/or similar mathematical operations as a classical Farrow decimator (e.g., based on a transposed Farrow structure), and can processes P samples at once per clock cycle. Digital signal processing apparatus 200 produces P time-consecutive output samples per clock (parallelism greater than 1). The plurality of processing cores includes P identical processing cores, which can include modified Farrow cores. Each processing core includes dot cores and a polynomial evaluator used in a modified Farrow core, or used in a modified Farrow implementation. The time accumulator 295 accumulates fractional samples in the half-open interval [0; P) with an increment of P×Δt. Whenever the time accumulator 295 overflows, the decimator emits P output samples.

P input samples are given to respective P processing cores to provide M output samples each. The plurality of processing cores 220*a-f* includes P identical processing cores or modified Farrow cores, associated with different processing times, such as t, t+Δt, t+2Δt, . . . . A processing core 220*a-f* could be implemented as a modified Farrow core (600 of FIG. 6), which includes a plurality of dot cores and a polynomial evaluator. The modified Farrow cores each provide M output samples to combiner nodes 230*a-c* of the highest hierarchical level 240*a* of the combiner logic 210.

The area efficient implementation of the combiner logic 210 ensures that every modified Farrow core or processing core 220 contributes to the correct subset of M samples in the output accumulator 290.

A given combiner node takes two or more sets of input samples, such as sets of M input samples, and combines them into one combined set of output samples. The combined set of output samples serves as a set of input samples of a combiner node on the next lower hierarchical level. The output samples (e.g., P+M−1 samples) of the combiner node 230*f* of the lowest hierarchical level 240*c* are provided to the shifter 270 as input samples.

The shifter is configured to append and/or prepend zeros, for example P−1 zeros, to its input samples and to select samples, for example 2P+M−2 samples, from the zero-padded set of samples. The selected samples, such as 2P+M−2 samples, are provided to the accumulator 290. 2P+M−2 samples are accumulated, that is P current samples and P+M−2 future samples, in the output accumulator 290, to provide the output samples 280, such as P output samples, which is serving as the output samples of the signal processing apparatus.

The combiner logic or the combination of sets of samples proceeds in two stages: combining and shifting. The combining stage combines the sets of input samples so that output sample sets of M samples of the processing cores 220*a-f* (or modified Farrow cores 220*a-f*) are provided to the combiner nodes 230*a-c* of the first hierarchical level 240*a* of the combiner logic. Assuming $P=2^H$, the combining process involves a hierarchical structure 240, which is a perfect binary tree with a height of H−1. There are H hierarchical levels involved in the process with $P/2^{h+1}$ combiner nodes at hierarchical level h, where h=0 . . . H−1. The final combiner node produces P+M−1 time-consecutive samples. These become shifted by the following shifting block or shifter 270 to the correct position for accumulation by the accumulator 290.

The shifting performed by the shifter 270 includes appending and/or prepending zeros to a set of input samples, such as P+M−1 samples, resulting in a zero-padded set of samples, for example 3P+M−3 samples. A set of output samples, for example 2P+M−2 samples, are selected from the set of zero-padded samples, to correct the position of the samples for the accumulation by the accumulator 290. The operation of a "combiner node" at a hierarchical level h is depicted in FIG. 3, the operation of a shifter is described in FIG. 4, and an example of an implementation is given in FIG. 7.

Figure 3:
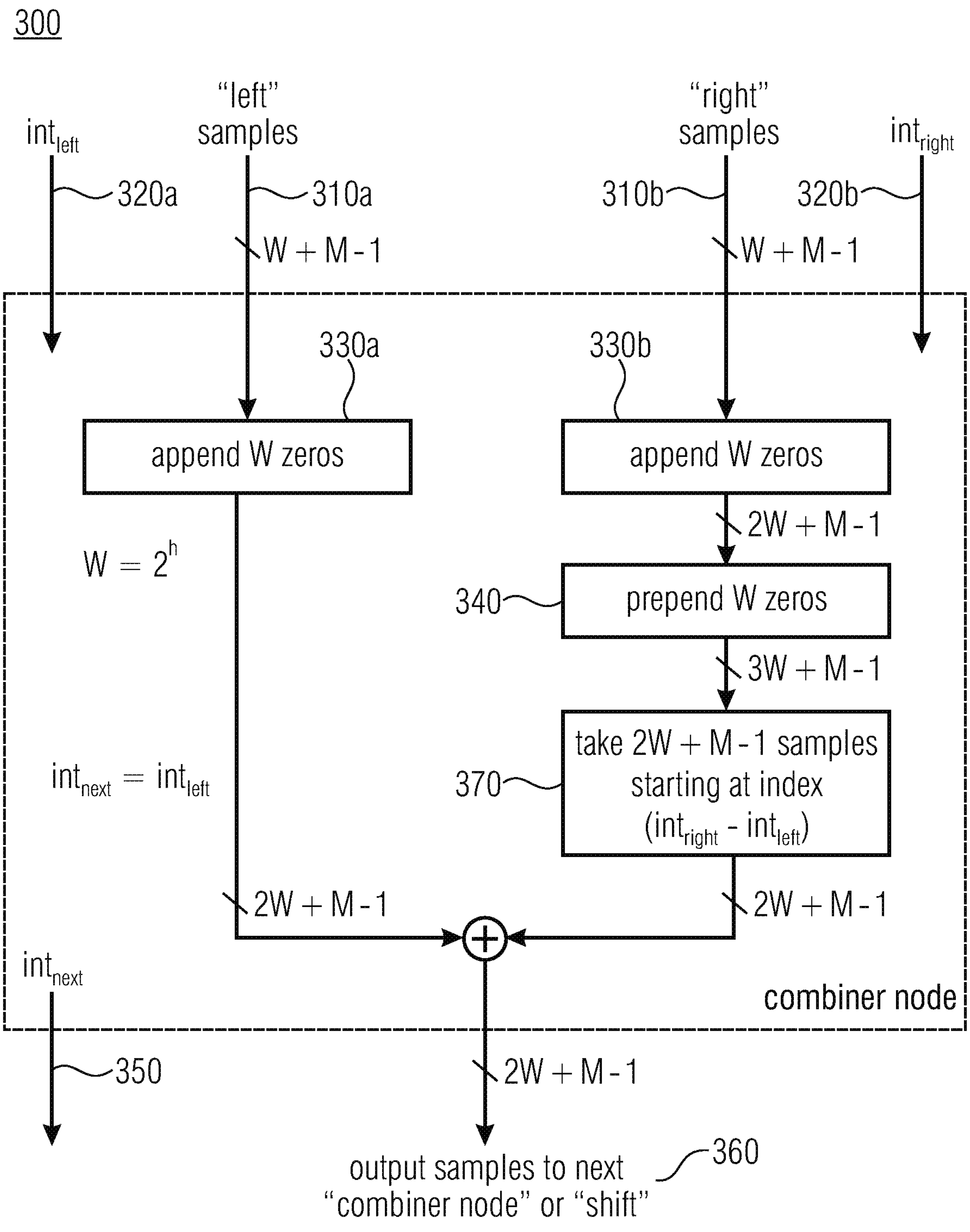
FIG. 3 is a block diagram of an exemplary combiner node of a combiner logic with two sets of input samples according to embodiments of the present invention.

FIG. 3 is a block diagram of an exemplary combiner node 300 according to embodiments of the present invention. Inputs of the combiner node 300 includes two sets of samples 310*a-b* with respective time information 320*a-b*. The combiner node 300 provides a set of output samples 360 of the input samples 310 with associated time information 350. The example of FIG. 3 is a portion of the binary tree structure that results when the number of processing cores is a power of two (e.g., $P=2^H$), and this number is factored according to $$P=\prod_{k=0}^{H-1} p_k$$

with all $p_k=2$. A combiner node 300 at a given hierarchical level h is configured to combine the sets of input samples 310*a-b* into the set of output samples 360. The sets of input samples 310*a-b* have equal amounts of samples, for example W+M−1 samples, where W is described by $W=2^h$, wherein h represent the hierarchical level of the given combiner node, and h=0 is the highest hierarchical level and h increases by one as the hierarchical level is decreasing.

The combiner node 300 appends and/or prepends W zeros (e.g., 330*a*, 330*b*) to the first and second sets of input samples 310*a-b* and prepends W zeros 340 to the second set of input samples. A predetermined number of samples 370 (e.g., example 2 W+M−1 samples) are selected from the zero padded sets of input samples. The selected sets of zero-padded input samples are combined, for example, using an addition operation to generate an output sample set (e.g., with 2 W+M−1 samples). The selected samples 370 from the zero-padded samples (e.g., 3 W+M−1 samples) are generated by selecting 370 samples (e.g., 2 W+M−1 samples) starting at a starting index based on the time information 320*a-b* associated with the sets of input samples.

The starting index of the selection 370 can be obtained based on the time information associated with the sets of input samples. For example, the starting index can be based on a difference between the time information associated with the second set of input samples and the time information associated with the first set of input samples, or can be determined according to the equation:

$$\text{index}=\text{int}_{second}-\text{int}_{first} \text{ or } \text{index}=\text{int}_{right}-\text{int}_{left}.$$

Combiner node 300 associates time information 350 with a set of output samples 360 provided by the given combiner node 300. The time information 350 associated with the set of output samples 360 are dependent on the time information 320*a-b* associated with the sets of input samples provided to the combiner node 300 for the respective hierarchical level of the combiner node 300. For example, the time information associated with the output samples 360 is equal to the time information 320*a-b* associated with one of the sets of input samples 310*a-b*.

FIG. 3 is a block diagram of an exemplary combiner node 300 that can be used with a digital signal processing apparatus 100 of FIG. 1 according to embodiments of the present invention. Combiner nodes 300 are organized in a hierarchical tree structure in a combiner logic 110 of FIG. 1 to combine the results of the plurality of processing cores 120*a-f* of FIG. 1 into a common set of output samples, and to associate a time information 350 to the output samples 360 depending on the time information 320*a-b* associated with the sets of input samples 310*a-b*. The output samples 360 serve as input samples for a combiner node on the next lower hierarchical level or for a shifter 270 of FIG. 2.

Figure 4:
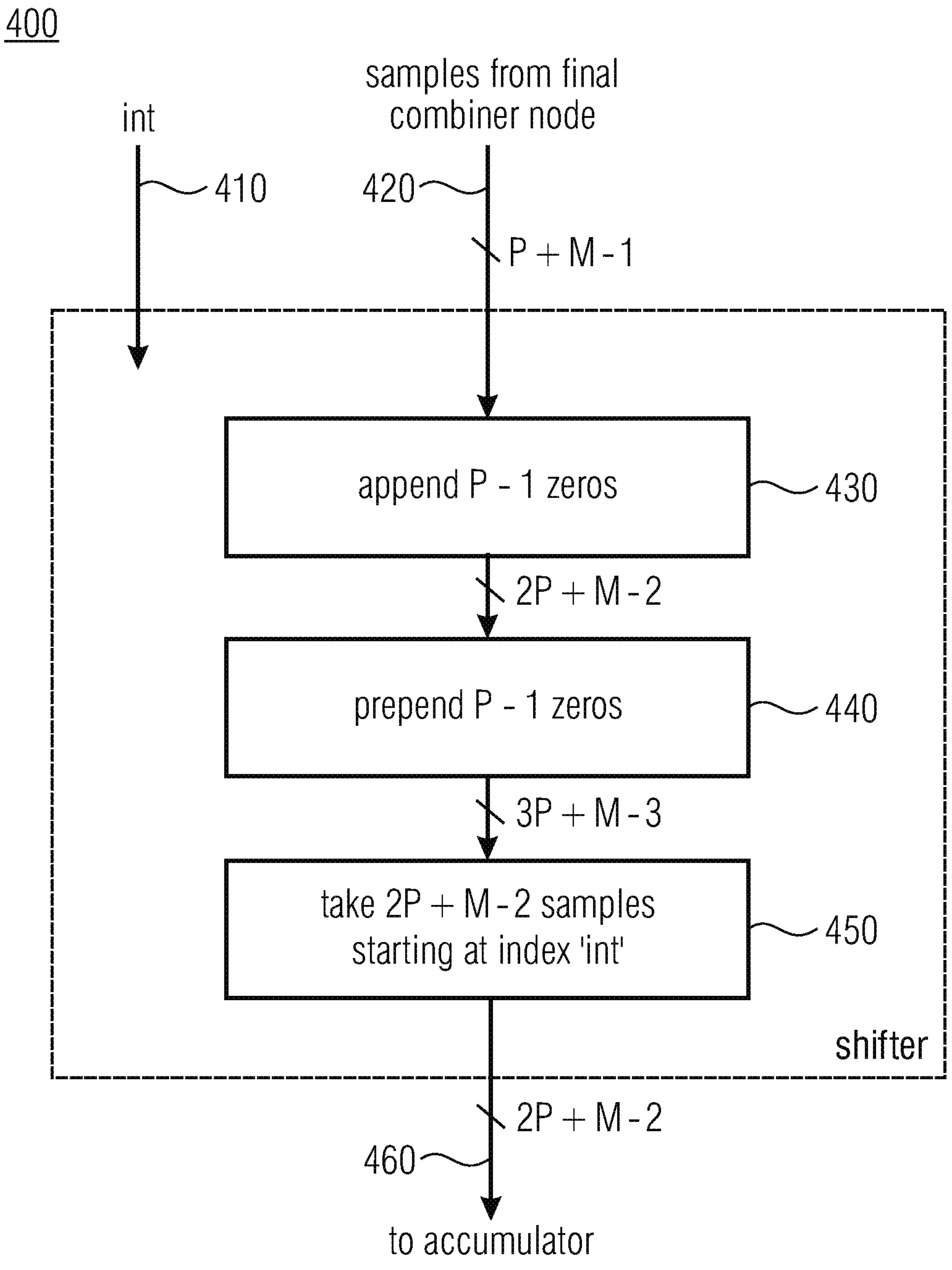
FIG. 4 is a block diagram of an exemplary shifter according to embodiments of the present invention.

FIG. 4 is a block diagram of an exemplary shifter 400 according to embodiments of the present invention. A set of input samples 420 with associated time information 410 is provided to the shifter 400 by the combiner node on the lowest hierarchical level of a combiner logic 110 of FIG. 1. The shifter 400 provides a set of output samples 460 to the accumulator 290 of FIG. 2. The set of input samples 420 (e.g., P+M−1 samples) are provided to the shifter 400. Zeros are appended 430 and/or prepended 440 to the set of input samples 420. For example P−1 zeros are appended and P−1 zeros are prepended to the set of input samples, resulting in a set of zero-padded input samples (e.g., 3P+M−3 samples). The output samples (e.g., 2P+M−2 samples) are selected 450 from the set of zero-padded input samples by starting the selection 450 at a starting index associated with the time information 410. The starting index can be equal to the time information 410, for example. The selected samples (e.g., 2P+M−2 samples) are the output samples 460 provided to the accumulator 290 of FIG. 2. The shifter 400 receives input samples 420 with associated time information 410 from the combiner logic 210 of FIG. 2 and corrects the position of the input samples for the accumulator 290 of FIG. 2.

Figure 5:
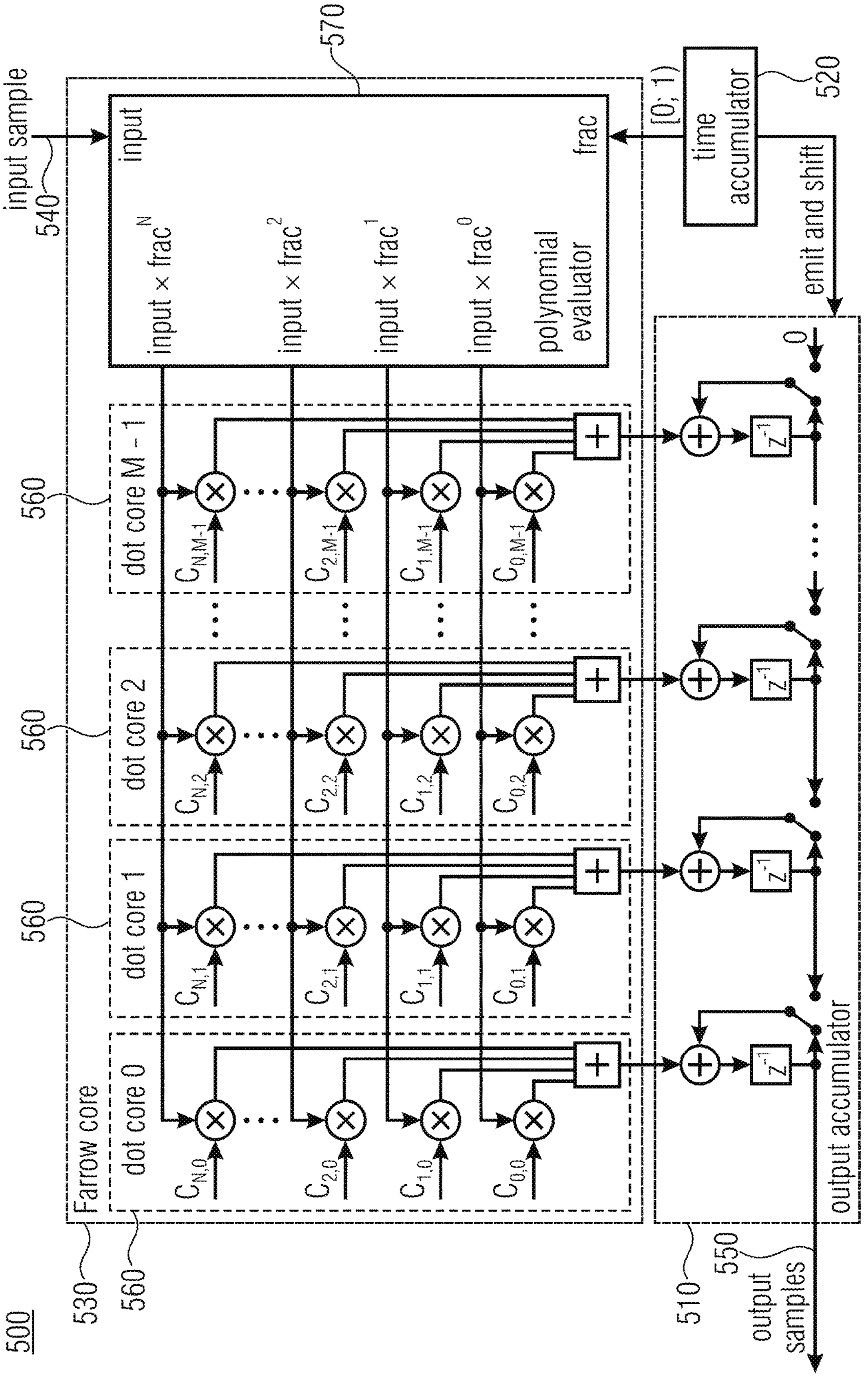
Fig. 5 (Prior Art)
FIG. 5 is a block diagram of an exemplary Farrow decimator (conventional) transposed Farrow structure according to embodiments of the present invention.

FIG. 5 is a block diagram of an exemplary conventional Farrow decimator 500 (e.g., a transposed Farrow structure) according to embodiments of the present invention. The Farrow decimator 500 includes an output accumulator 510, a time accumulator 520, and a Farrow core 530. The time accumulator 520 accumulates fractional samples in the half-open interval [0; 1), with an increment of Δt. When the time accumulator overflows, it requests a shifting and an emission of an output sample 550 from the output accumulator 510. The Farrow decimator 500 produces one output sample 550 per clock cycle, whenever the time accumulator 520 overflows. The accumulated fractional time is also provided to a polynomial evaluator 570 of the Farrow core 530.

The modified Farrow core 530 includes a plurality of dot cores 560 and a polynomial evaluator unit 570. The Farrow decimator 500 accepts one input sample per clock cycle. The input of the Farrow decimator 500 is the input of the polynomial evaluator 570. The polynomial evaluator 570 has a further input coupled to the time accumulator 520 and is coupled to each dot core 560. The polynomial evaluator 570 takes an input sample and fractional time input from the time accumulator 520 and multiplies the input sample by successive powers 0, 1, . . . N of the accumulated fractional time to provide a set of samples to the dot cores 560. The dot cores 560 are coupled to the polynomial evaluator 570 and to the output accumulator 510. Each dot core 560 computes a dot product (scalar vector product) between a vector of coefficients and the vector of output values of the polynomial evaluator 570. The output of the modified Farrow core 530 are the output samples of the plurality of dot cores 560. The output samples of the plurality of dot cores 560 are provided to the output accumulator 510.

The output accumulator 510 takes the outputs of the dot cores 560 as input values and outputs an output sample 550, which is the output sample of the Farrow decimator 500. The output accumulator accumulates and/or integrates the results of the dot cores 560. The output accumulator emits an output sample 550 and shifts the accumulated dot product values, for example in a shift register, when the time accumulator 520 overflows. The time accumulator accumulates fractional time and provides it to the polynomial evaluator 570 of the Farrow core 530. When the time accumulator 520 overflows, it requests a new output sample 550 and shifting the values held in the output accumulator 510, for example in the form of a shift register, by one position.

The dot products are provided to the output accumulator 510 by the dot cores 560 of the Farrow core 530. The dot cores 560 compute a dot product or a scalar vector product between a vector of coefficients and a corresponding output vector of a polynomial evaluator 570 of the modified Farrow core 530. The polynomial evaluator 570 takes an input sample 540, which is the input sample of the Farrow core 530 and the input sample of the Farrow decimator 500, and fractional time input from the time accumulator 520 and multiplies the input sample by successive powers 0, 1, . . . N of the accumulated fractional time to provide a set of values for the dot cores 560. The Farrow decimator 500 is a conventional decimator which processes one sample at a time (parallelism equal to 1). Comparing the digital signal processing apparatus 100 of FIG. 1 to the conventional Farrow decimator 500 of FIG. 5, digital signal processing apparatus 100 can be addressed on a parallel DSP, in real time, or in about real time for high sample rates. For example, the digital signal processing apparatus 100 of FIG. 1 may address sample rates of 100 Gigasamples per second in real-time or about real-time, which may not be possible with conventional Farrow decimator 500.

The digital signal processing apparatus 100 of FIG. 1 includes a plurality of processing cores 120 for parallel processing. For example, the processing cores 120 of FIG. 1 may implement modified Farrow cores (600 of FIG. 6) that include a Farrow core 530. A combiner logic 110 of FIG. 1 combines the output values of the multiple modified Farrow cores 600 of FIG. 6 that are used as a plurality of processing cores 120 of FIG. 1. Moreover the signal processing apparatus uses a single time accumulator (e.g., time accumulator 295 of FIG. 2), instead of multiple time accumulators 520 per each processing core or Farrow core 530 allowing the modified Farrow cores 600 of FIG. 6 to perform processing operations in parallel. Digital signal processing apparatus 100 of FIG. 1 includes processing cores 120 of FIG. 1, which can be modified Farrow cores 600 of FIG. 6.

Figure 6:
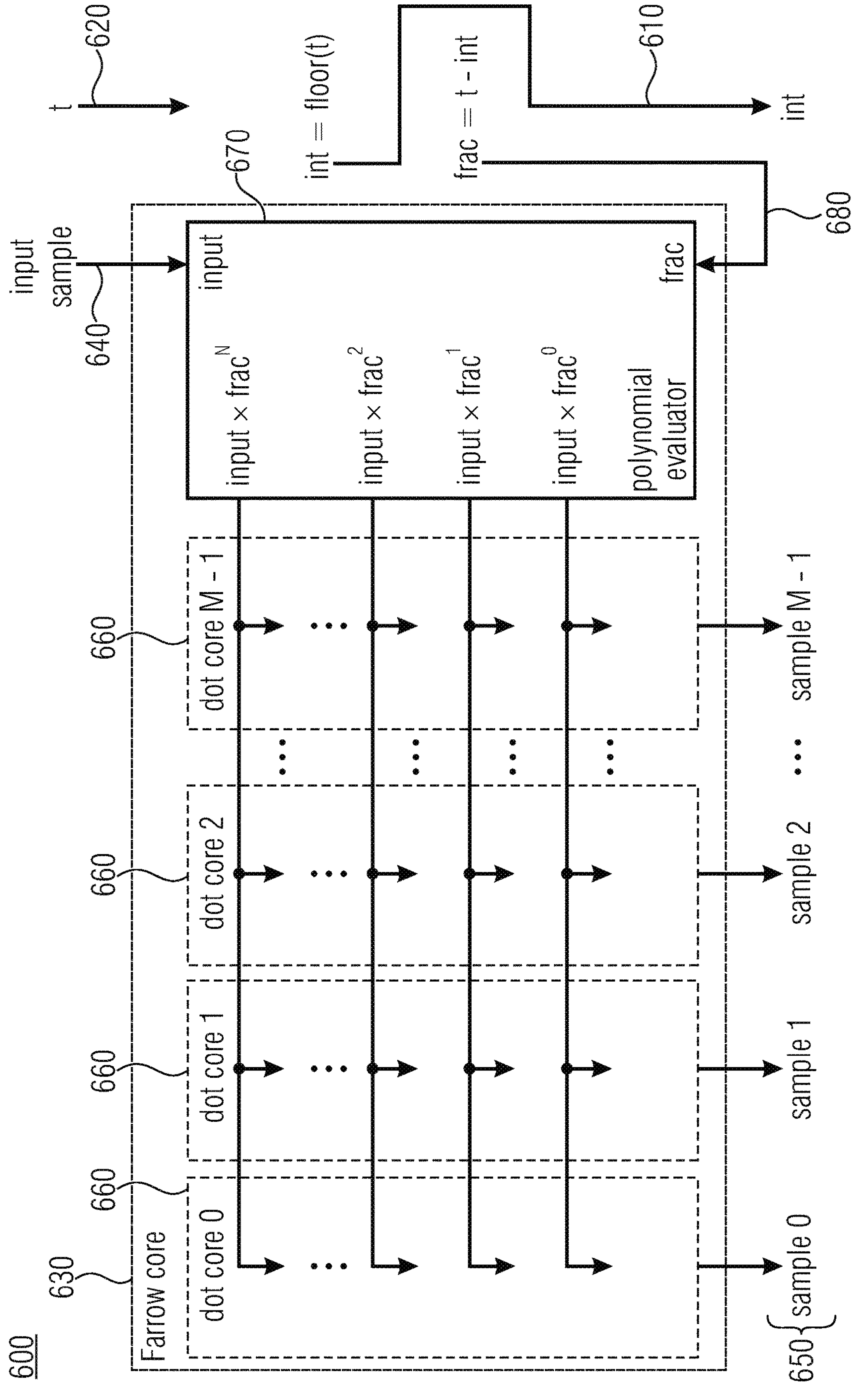
FIG. 6 is a block diagram of an exemplary modified Farrow core for computation of int and frac according to embodiments of the present invention.

FIG. 6 shows a block diagram of a modified Farrow core 600 according to embodiments of the present invention. The modified Farrow core 600 (e.g., modified Farrow core 630) takes an input sample 640 with associated time information 620 as input and provides a plurality of samples or a set of samples 650 and an associated time information 610 as output. Every modified Farrow core 630 takes one sample and a fractional sample time as inputs and contributes to M output samples. The modified Farrow core 630 includes a plurality of dot cores 660 and a polynomial evaluator unit 670.

The polynomial evaluator 670 takes an input sample and fractional time input 680 based on the time information 620 and multiplies the input sample by successive powers 0, 1, . . . . N of the accumulated fractional time to provide a set of samples to the dot cores 660. The dot cores 660 are coupled to the polynomial evaluator 670. Each dot core 660 computes a dot product or a scalar vector product between a vector of coefficients and a corresponding output vector of a polynomial evaluator 670. The output of the modified Farrow core 630 is a set of output samples 650 of the plurality of dot cores 660. Further, the modified Farrow core provides a time information 610 associated with the set of output samples 650. An integer value of the accumulated fractional time is provided as a time information output associated with the set of output samples 650 as an output time information value 610. A fractional time value of the accumulated fractional time 680 is provided to the polynomial evaluator 670.

As depicted in FIG. 1, digital signal processing apparatus 100 includes a plurality of processing cores 120 for parallel processing, and the processing cores 120 of FIG. 1 may be modified Farrow cores 600. Combiner logic 110 of FIG. 1 combines the output values of the multiple modified Farrow cores 600 used as a plurality of processing cores 120 of FIG. 1. Moreover, the signal processing apparatus uses a single time accumulator (e.g., time accumulator 295 of FIG. 2) instead of multiple time accumulators per each processing cores or modified Farrow cores 600 allowing the modified Farrow cores 600 to perform processing in parallel operations.

According to some embodiments, the processing cores or modified Farrow cores compute or approximate the continuous time response of support M to an input sample value given a time value input, such as time information 620 or 680. For example, in a polyphase implementation, the coefficients are determined from the fractional timing information 680 based on a mathematical relationship and/or a look-up table.

According to some embodiments, Δt (the inverse of the decimation ratio) can be equal to 1, and Δt does not have to be a constant.

According to some embodiments, the parallelism P is not restricted to integer powers of two. If $P=p_0p_1 \ldots p_{H-1}$ is a factorization of P, the combiner logic can be implemented as a hierarchical tree of height H−1 of combiner nodes having $p_h$ sets of input samples at hierarchy level h, where $p_k$ does not have to be prime numbers, and different intervals for representing time accumulation or fractional timing information are can be used, such as [−0.5; P−0.5), [−0.5; 0.5) or [−1; 1).

Figure 7:
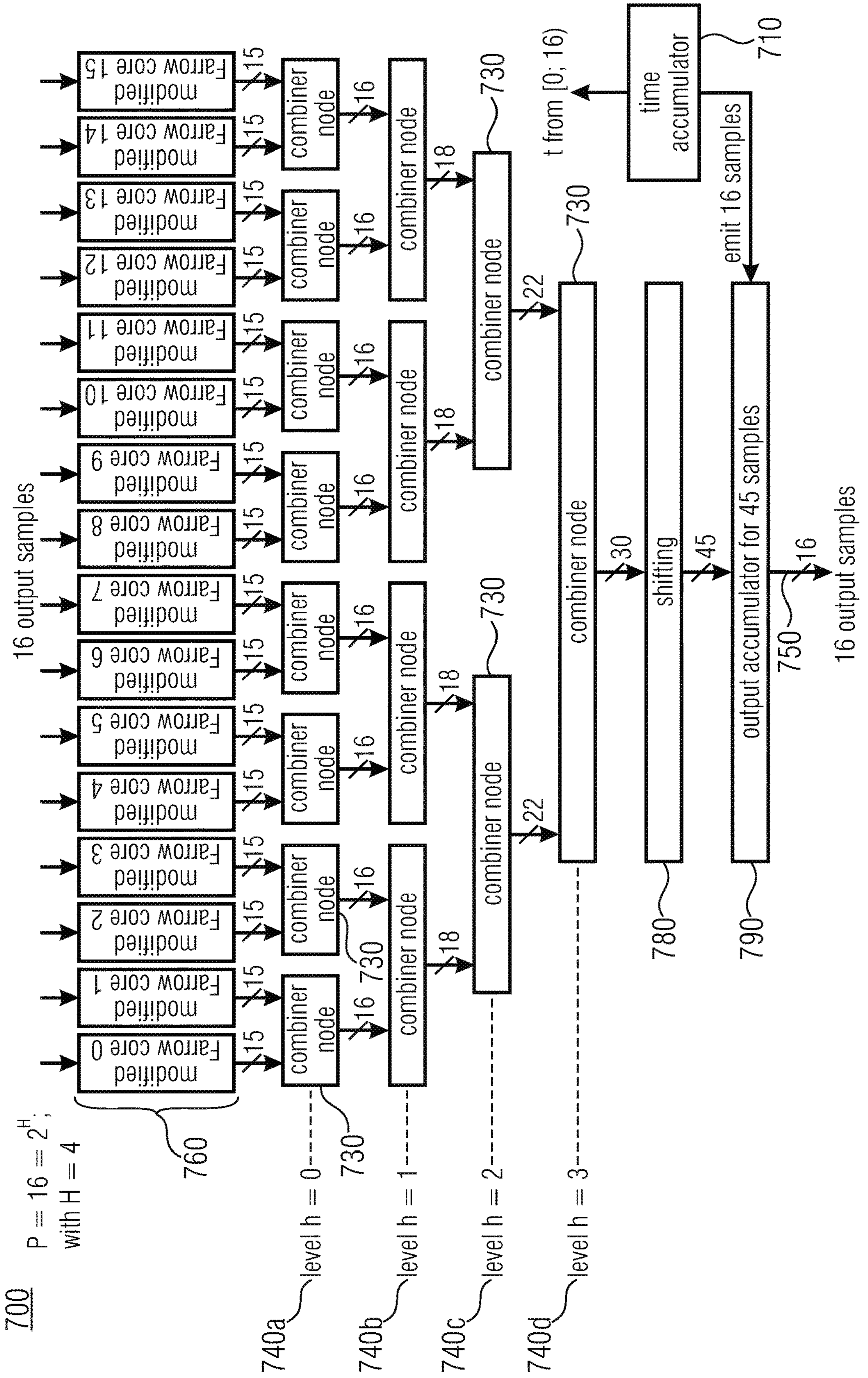
FIG. 7 is a block diagram of an exemplary extended signal processing apparatus according to embodiments of the present invention.

FIG. 7 depicts an exemplary digital signal processing apparatus 700 having P=16 processing cores and every processing core outputs M=15 output samples according to embodiments of the present invention. Digital signal processing apparatus 700 includes a time accumulator 710 that accumulates fractional samples in a half-open interval, for example [0:16), with an increment of 16×Δt, wherein Δt is within the interval, for example (0:1]. The accumulated fractional time is provided to the processing cores, as depicted in FIG. 1, along with 16 input samples. A processing core 760 provides output samples from the input sample with associated time information to the combiner nodes of the highest hierarchical level 740*a*. Each combiner node 730 on the highest hierarchal level takes two sets of input samples along with associated time information and outputs one set of output sample with associated time information.

The combiner nodes 730 on the second highest hierarchical level 740*b* receives two sets of input samples along with associated time information and provide a set of output sample with associated time information. The combiner nodes 730 on the next lower hierarchical level 740*c* receive for example two sets of input samples along with associated time information and provide a set of output sample with associated time information. The combiner node on the lowest hierarchical level 740*d* receives two sets of input samples along with associated time information and provides a set of output samples with associated time information.

The output of the combiner node 730 on the lowest hierarchical level 740*d* is provided to a shifter 780 to correct the position of the samples for the accumulator 790. The shifter 780 provides samples to the accumulator 790. The accumulator 790 accumulates and/or integrates the samples provided by the shifter 780 into a set of output samples. All samples in a subset provided by a combiner node are provided as input samples to a combiner node in a next hierarchical level. Combiner nodes in different hierarchical levels provide 16, 18, 22, or 30 samples as inputs to combiner nodes of lower hierarchical level or to the shifter 780. The modified Farrow core 760 can be similar to the modified Farrow core 600 of FIG. 6, which in this example produces 15 output samples based on one input sample and the timing information from the time accumulator 710.

Embodiments of the present invention enable continuous time impulse response to a sampled input waveform, and a selection of an output sample rate different from the input sample rate. The convolution kernel can be applied at the input sample rate. If the kernel is designed to attenuate images at the input rate, this allows flexible (almost arbitrary) sample rate conversion towards higher sample rates.

Advantageously, embodiments of the present invention provide highly flexible data rate processing at very high speeds, and/or significant gain in integration density. Useful applications include integrated high data rate modems where frequency and phase of the receiver sampling clock are aligned with the transmitter, and where the sampling clock is higher than the system clock of the DSP, and integrated radios that support multiple communication standards and where some or all of the recommended or required sample rates are above the DSP clock speed and are not convenient ratios of one another.

Figure 8:
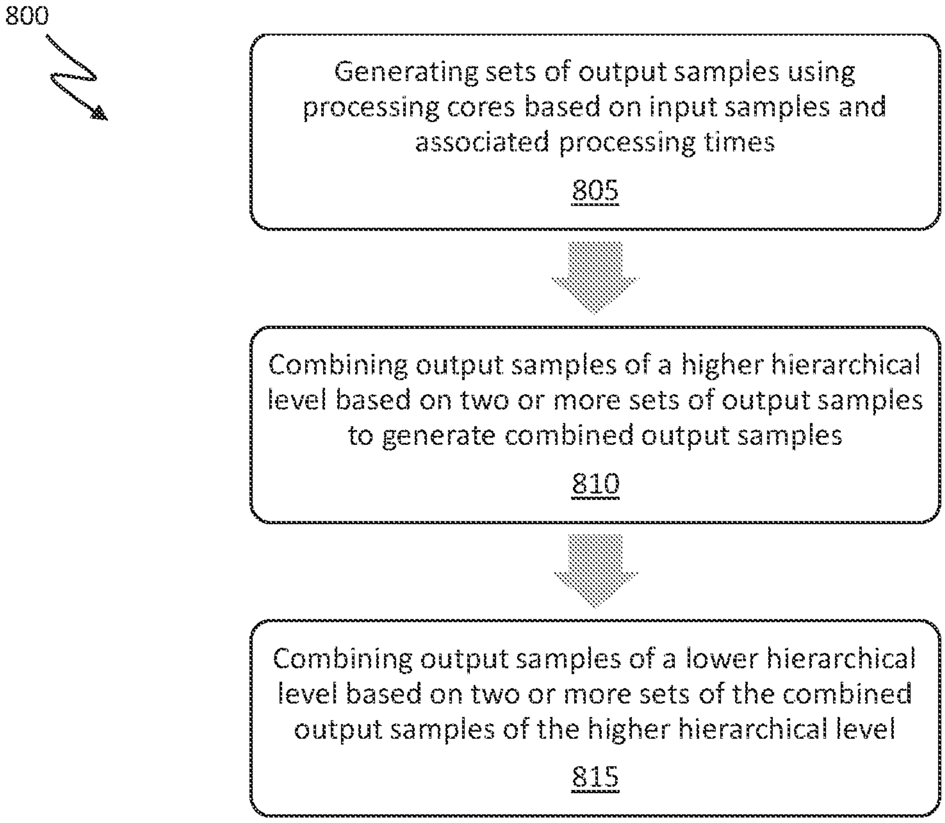
FIG. 8 is a flowchart depicting an exemplary sequence of computer implemented steps for generating a plurality of output samples based on a set of input samples according to embodiments of the present invention.

FIG. 8 is a flowchart depicting an exemplary sequence of computer implemented steps 800 for generating a plurality of output samples based on a set of input samples according to embodiments of the present invention.

At step 805, sets of output samples are generated using processing cores based on input samples and associated processing times. The output samples include a hierarchical tree structure of a plurality of hierarchical levels.

At step 810, output samples of a higher hierarchical level are combined based on two or more sets of output samples output samples to generate combined output samples.

At step 815, output samples of a lower hierarchical level are combined based on two or more sets of the combined output samples of the higher hierarchical level.

Embodiments of the present invention are thus described. While the present invention has been described in particular embodiments, it should be appreciated that the present invention should not be construed as limited by such embodiments, but rather construed according to the following claims.

What is claimed is:

1. A signal processing apparatus for generating a plurality of output samples based on a plurality of input samples, the signal processing apparatus comprising:

a plurality of processing cores configured to perform processing operations based on sets of the plurality of input samples and an associated processing time to generate sets of processing core output samples; and a sample combiner logic unit coupled to the plurality of processing cores and configured to provide the plurality of output samples from the sets of processing core output samples, wherein the sample combiner logic unit is operable to process the sets of processing core output samples using a hierarchical tree structure having a plurality of hierarchical levels of combiner nodes, the sample combiner logic unit comprising:

a first combiner node associated with a higher hierarchical level that is operable to output a first set of combined output samples based on two or more sets of processing core output samples, and a second combiner node associated with a lower hierarchical level that is operable to output a second set of combined output samples based on at least the first set of combined output samples of the higher hierarchical level, wherein the second set of combined output samples includes more samples than the first set of combined output samples, wherein the sets of the plurality of input samples are shifted by the plurality of processing cores based on time information associated with the sets of the plurality of input samples.

2. The signal processing apparatus according to claim 1, wherein a target output sample rate of the plurality of output samples is no greater than an input sample rate of the plurality of input samples.

3. The signal processing apparatus according to claim 1, further comprising a time accumulator operable to:

track a global processing time; and access the plurality of output samples from an output register coupled to the sample combiner logic unit when the global processing time overflows at a predetermined multiple of a sampling period of the plurality of output samples.

4. The signal processing apparatus according to claim 1, wherein a number of samples in the sets of samples in a same hierarchical level that are provided to combiner nodes as inputs are equal.

5. The signal processing apparatus according to claim 1, wherein a number of samples in sets of output samples generated by combiner nodes in a same hierarchical level are equal.

6. The signal processing apparatus according to claim 1, wherein the sample combiner logic unit is further operable to provide a number of input samples included in the plurality of input samples, wherein the number of input samples progressively increases as a respective hierarchical level decreases.

7. The signal processing apparatus according to claim 1, wherein a first set of samples that are input into a respective combiner node and a second set of samples that are output samples of the respective combiner node are based on at least one of:

a number of samples of the sets of processing core output samples output by a respective processing core;

a hierarchical level of the respective combiner node; or a factorization of a number of processing cores as integer factors.

8. The signal processing apparatus according to claim 1, wherein a number of a first set of samples that are input into a respective combiner node is based on a factorization of a number of processing cores into integer factors.

9. The signal processing apparatus according to claim 1, wherein:

a number of a first set of samples that are input into a respective combiner node of a hierarchical level is equal to $p_h$, $p_k$ represent integer factors of P according to $$P = \prod_{k=0}^{H-1} p_k,$$

P represents a number of processing cores,

H represents a total number of factors in a chosen integer factorization, and h represents a hierarchical level of the respective combiner node.

10. The signal processing apparatus according to claim 1, wherein:

the second set of combined output samples is a combination of sets of samples input into the second combiner node, and a number of samples of the sets of samples input into the second combiner node are shifted with respect to one another before being combined.

11. The signal processing apparatus according to claim 1, wherein:

a respective combiner node is operable to provide a respective set of combined output samples by summing sets of samples input into the respective combiner node, the sets of samples input into the respective combiner node are padded after the summing, and a number and a position of padding of the sets of samples input into the respective combiner node is based on time information of the sets of samples input into the respective combiner node.

12. The signal processing apparatus according to claim 1, wherein:

the first combiner node associated with the higher hierarchical level is further operable to receive time information associated with the two or more sets of processing core output input samples, and the time information corresponds to a processing time associated with the sets of processing core output samples.

13. The signal processing apparatus according to claim 1, further comprising an output register configured to:

store the plurality of output samples; and to accumulate and integrate values of the plurality of output samples.

14. The signal processing apparatus according to claim 1, further comprising an accumulator and a shift register.

15. The signal processing apparatus according to claim 1, wherein the plurality of processing cores comprise a transposed Farrow structure.

16. The signal processing apparatus according to claim 1, wherein the hierarchical tree structure comprises a plurality of subtrees derived from integer factors of the plurality of processing cores.

17. The signal processing apparatus according to claim 1, wherein the hierarchical tree structure comprises a plurality of subtrees derived from orderings of integer factors of the plurality of processing cores.

18. A method of providing a plurality of output samples based on a plurality of input samples, the method comprising:

generating sets of processing core output samples using a plurality of processing cores, wherein said generating is based on sets of the plurality of input samples and associated processing times for the sets of the plurality of input samples, processing the sets of processing core output samples by a sample combiner logic unit comprising a hierarchical tree structure comprising a plurality of hierarchical levels of combiner nodes, the processing comprising:

combining output samples of a higher hierarchical level to generate first combined output samples; and combining at least the first combined output samples to generate second combined output samples, wherein the second combined output samples include more samples than the first combined output samples.

19. A non-transitory computer-readable storage medium having embedded therein program instructions, which when executed by one or more processors of a device, causes the device to execute a method of generating a plurality of output samples based on a plurality of input samples, the method comprising:

generating sets of processing core output samples using a plurality of processing cores, wherein said generating is based on sets of the plurality of input samples and associated processing times for the sets of the plurality of input samples, processing the sets of processing core output samples by a sample combiner logic unit comprising a hierarchical tree structure comprising a plurality of hierarchical levels of combiner nodes, the processing comprising:

combining output samples of a higher hierarchical level to generate first combined output samples; and combining at least the first combined output samples to generate second combined output samples, wherein the second combined output samples include more samples than the first combined output samples.

* * * * *